(12) United States Patent
Chiu

(10) Patent No.: US 10,985,134 B2
(45) Date of Patent: Apr. 20, 2021

(54) METHOD AND SYSTEM OF MANUFACTURING STACKED WAFERS

(71) Applicant: NANYA TECHNOLOGY CORPORATION, New Taipei (TW)

(72) Inventor: Hsih-Yang Chiu, Taoyuan (TW)

(73) Assignee: Nanya Technology Corporation, New Taipei (TW)

( * ) Notice: Subject to any disclaimer, the term of this patent is extended or adjusted under 35 U.S.C. 154(b) by 0 days.

(21) Appl. No.: 16/186,100

(22) Filed: Nov. 9, 2018

(65) Prior Publication Data
US 2020/0152600 A1 May 14, 2020

(51) Int. Cl.
*H01L 21/76* (2006.01)
*H01L 21/78* (2006.01)
*H01L 23/00* (2006.01)
*H01L 21/768* (2006.01)

(52) U.S. Cl.
CPC ........ *H01L 24/94* (2013.01); *H01L 21/76898* (2013.01); *H01L 21/78* (2013.01); *H01L 24/81* (2013.01)

(58) Field of Classification Search
CPC .... H01L 33/502; H01L 33/486; H01L 33/644
USPC ......................................................... 257/98
See application file for complete search history.

(56) References Cited

U.S. PATENT DOCUMENTS

| | | | | |
|---|---|---|---|---|
| 2005/0282374 A1* | 12/2005 | Hwang | ................... | H01L 25/50 438/613 |
| 2008/0308946 A1* | 12/2008 | Pratt | ................... | H01L 25/0657 257/777 |
| 2010/0244233 A1* | 9/2010 | Kim | ........................ | H01L 24/81 257/693 |
| 2010/0246152 A1* | 9/2010 | Lin | ......................... | H01L 24/92 361/783 |
| 2011/0024881 A1* | 2/2011 | Bhagath | ............... | H01L 21/563 257/618 |
| 2011/0026232 A1* | 2/2011 | Lin | ....................... | H01L 23/481 361/760 |
| 2011/0156233 A1* | 6/2011 | Kim | .................. | H01L 21/76898 257/686 |
| 2012/0139124 A1* | 6/2012 | Oganesian | .............. | H01L 25/50 257/774 |

(Continued)

FOREIGN PATENT DOCUMENTS

CN 106711090 A 5/2017
CN 106711090 A 5/2017

(Continued)

OTHER PUBLICATIONS

Office Action dated Mar. 27, 2020 related to Taiwanese Application No. 107143475.

(Continued)

*Primary Examiner* — Sheikh Maruf
(74) *Attorney, Agent, or Firm* — Muncy, Geissler, Olds & Lowe, P.C.

(57) ABSTRACT

The present disclosure provides a method of manufacturing stacked wafers. The method includes receiving a first wafer having semiconductor components formed therein; receiving a second wafer having semiconductor components formed therein; attaching the first wafer to the second wafer; and forming a set of stacked wafers by thinning the second wafer, using the first wafer as a holder.

14 Claims, 18 Drawing Sheets

30

(56) References Cited

U.S. PATENT DOCUMENTS

| | | | | |
|---|---|---|---|---|
| 2012/0282735 A1* | 11/2012 | Ahn | H01L 21/6835 | 438/109 |
| 2013/0175700 A1* | 7/2013 | Chen | H01L 24/16 | 257/774 |
| 2013/0175702 A1* | 7/2013 | Choi | H01L 23/3114 | 257/774 |
| 2014/0252579 A1* | 9/2014 | Chang | H01L 21/76898 | 257/676 |
| 2015/0001685 A1* | 1/2015 | Chung | H01L 24/94 | 257/621 |
| 2015/0014844 A1* | 1/2015 | Wu | H01L 23/28 | 257/737 |
| 2015/0069624 A1* | 3/2015 | Pham | H01L 25/0652 | 257/774 |
| 2015/0137357 A1* | 5/2015 | Kikuchi | H01L 23/49838 | 257/737 |
| 2015/0214201 A1* | 7/2015 | Schug | H01L 23/481 | 257/88 |
| 2015/0235990 A1* | 8/2015 | Cheng | H01L 24/97 | 257/712 |
| 2015/0263005 A1* | 9/2015 | Zhao | H01L 25/50 | 257/777 |
| 2015/0270304 A1* | 9/2015 | Saito | H01L 21/50 | 257/459 |
| 2015/0279825 A1* | 10/2015 | Kang | H01L 21/76898 | 257/48 |
| 2015/0311175 A1* | 10/2015 | Ho | H01L 24/02 | 257/777 |
| 2015/0364457 A1* | 12/2015 | Chen | H01L 25/0657 | 257/686 |
| 2015/0380339 A1* | 12/2015 | Zhao | H01L 21/76898 | 257/774 |
| 2016/0013151 A1* | 1/2016 | Shen | H01L 25/50 | 257/686 |
| 2016/0035648 A1* | 2/2016 | Zhou | H01L 21/561 | 257/713 |
| 2016/0155724 A1* | 6/2016 | Kim | H01L 23/3135 | 257/48 |
| 2016/0181174 A1* | 6/2016 | Gambino | H01L 21/4871 | 257/499 |
| 2017/0250172 A1* | 8/2017 | Huang | H01L 25/50 | |
| 2018/0166491 A1* | 6/2018 | Nagata | H01L 24/32 | |

FOREIGN PATENT DOCUMENTS

| | | |
|---|---|---|
| TW | 20101380 A1 | 4/2010 |
| TW | 201013801 A1 | 4/2010 |

OTHER PUBLICATIONS

Office Action dated Jul. 23, 2020 in TW Application No. 107143475 (4 pages).

* cited by examiner

METHOD AND SYSTEM OF MANUFACTURING STACKED WAFERS

TECHNICAL FIELD

The present disclosure relates to a method and a system for manufacturing stacked wafers, and more particularly, to a method for heterogeneous integration of wafers.

DISCUSSION OF THE BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allow more components to be integrated into a given area. As the demand for even smaller electronic devices has grown recently, a need has arisen for smaller and more creative packaging techniques of semiconductor dies.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a method of manufacturing stacked wafers. The method includes receiving a first wafer having semiconductor components formed therein; receiving a second wafer having semiconductor components formed therein; attaching the first wafer to the second wafer; and forming a set of stacked wafers by thinning the second wafer, using the first wafer as a holder.

In some embodiments, the method further includes making the first wafer based on a first technology; and making the second wafer based on a second technology different from the first technology.

In some embodiments, the method further includes attaching the first wafer face-to-face with the second wafer.

In some embodiments, the method further includes attaching the first wafer face-to-face with the second wafer using metal bumps.

In some embodiments, the method further includes singulating the set of stacked wafers, wherein the set of stacked wafers includes the first wafer and the thinned second wafer.

In some embodiments, the first wafer and the second wafer remain attached to one another before the singulation of the set of stacked wafers.

In some embodiments, the method further includes performing a through-silicon via (TSV) process on the set of stacked wafers after the formation of the set of stacked wafers.

Another aspect of the present disclosure provides a method of manufacturing stacked wafers. The method includes receiving a first set of stacked wafers of a first scale. The method further includes receiving a second set of stacked wafers of a second scale. The method further includes attaching the first set of stacked wafers to the second set of stacked wafers by attaching a thinned wafer of the first set of stacked wafers to a thinned wafer of the second set of stacked wafers. The method further includes forming a third set of stacked wafers of a third scale by thinning a non-thinned wafer of the second set of stacked wafers, using a non-thinned wafer of the first set of stacked wafers as a holder.

In some embodiments, the first scale is the same as the second scale.

In some embodiments, the first scale is different from the second scale.

In some embodiments, the first scale is larger than the second scale.

In some embodiments, the second scale is larger than the first scale.

In some embodiments, the non-thinned wafer of the first set of stacked wafers and the non-thinned wafer of the second set of stacked wafers are based on the first technology, while the thinned wafer of the first set of stacked wafers and the thinned wafer of the second set of stacked wafers are based on a second technology different from the first technology.

In some embodiments, the method further includes singulating the third set of stacked wafers.

In some embodiments, the non-thinned wafer and the thinned wafer of the first set of stacked wafers, and the non-thinned wafer and the thinned wafer of the second set of stacked wafers remain attached to one another before the third set of stacked wafers is singulated.

In some embodiments, the method further includes: performing a through-silicon via (TSV) process on the third set of stacked wafers after the formation of the third set of stacked wafers.

Another aspect of the present disclosure provides a system for manufacturing stacked wafers. The system includes a workstation and a bank. The workstation is configured to provide a set of pre-stacked wafers by attaching a first set of stacked wafers to a second set of stacked wafers in a manner in which a thinned wafer of the first set of stacked wafers is attached to a thinned wafer of the second set of stacked wafers. The bank is configured to receive the set of pre-stacked wafers from the workstation. The bank is further configured to store the set of pre-stacked wafers until the bank receives a request to manufacture a set of stacked wafers of a scale that is larger than a scale of one of the first set of stacked wafers and the second set of stacked wafers.

In some embodiments, the bank provides the set of pre-stacked wafers to the workstation in response to the request. The workstation manufactures a third set of stacked wafers by thinning a non-thinned wafer of the second set of stacked wafers of the set of pre-stacked wafers, using a non-thinned wafer of the first set of stacked wafers of the set of pre-stacked wafers as a holder.

In the present disclosure, a carrier wafer, which may not have undergone the front-end-of-line (FEOL) process, the middle-end-of-line (MEOL) process, the back-end-of-line (BEOL) process, or any combination thereof and therefore is not intended to be prepared to become a plurality of dies to perform circuit operation, is not required. One of two wafers, both of which are intended to be prepared to become a plurality of dies to perform circuit operation, serves as the other wafer's holder while a thinning process is performed.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should be understood to be connected to the figures' reference numbers, which refer to similar elements throughout the description.

DETAILED DESCRIPTION

Figure 1:
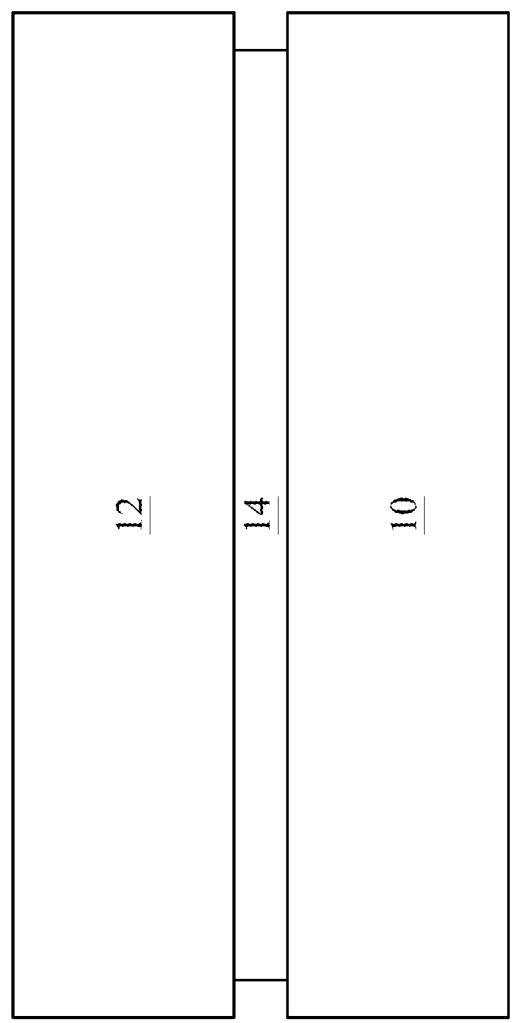
FIGS. 1 to 5 are cross-sectional views of intermediate steps of a comparative process for manufacturing a 3D integrated circuit (IC).

Embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Throughout the various views and illustrative embodiments, like reference numerals are used to designate like elements. Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, an apparatus in accordance with the present disclosure. It should be understood that elements not specifically shown or described may take various forms. Reference throughout this specification to "some embodiments" or "an embodiment" means that a particular feature, structure, or characteristic described in connection with the embodiment is included in at least one embodiment. Thus, the appearances of the phrases "in some embodiments" or "in an embodiment" in various places throughout this specification do not necessarily refer to the same embodiment. Furthermore, the particular features, structures, or characteristics may be combined in any suitable manner in one or more embodiments.

In the drawings, like reference numbers are used to designate like or similar elements throughout the various views, and illustrative embodiments of the present invention are shown and described. The figures are not necessarily drawn to scale, and in some instances the drawings have been exaggerated and/or simplified in places for illustrative purposes only. A person having ordinary skill in the art will appreciate the many possible applications and variations of the present invention based on the following illustrative embodiments of the present invention.

Unless otherwise defined, all terms (including technical and scientific terms) used herein have the same meaning as commonly understood by a person having ordinary skill in the art to which the embodiments of the present disclosure belong. It should be understood that terms, such as those defined in commonly used dictionaries, should be interpreted as having a meaning that is consistent with their meaning in the context of the relevant art and the present disclosure, and should not be interpreted in an idealized or overly formal sense unless expressly so defined herein.

FIGS. 1 to 5 are cross-sectional views of intermediate steps of a comparative process for manufacturing a 3D integrated circuit (IC).

Referring to FIG. 1, a wafer 12 is temporarily bonded to a carrier wafer 10 by, for example, a temporary adhesive 14. The wafer 12 has semiconductor components formed therein. For example, the wafer 12 includes a dynamic random accesses memory (DRAM) formed therein and thereon. The wafer 12 is based on a first technology. The term "technology" for a wafer may mean the size of transistors of a chip formed in the wafer, the size of the wafer, or any other terms used in the art. For example, the wafer 12 is a wafer, which is fabricated based on a complementary metal-oxide-semiconductor (CMOS) process. The carrier wafer 10 serves as a holder to hold the wafer 12 in the subsequent thinning process shown in FIG. 2. In some implementations, the carrier wafer 10 is not applied with the front-end-of-line (FEOL) process, the middle-end-of-line (MEOL) process, the back-end-of-line (BEOL) process, or any combination thereof. As such, there is no intention to design and fabricate the carrier wafer 10 to become a plurality of dies that will perform circuit operation.

Figure 2:
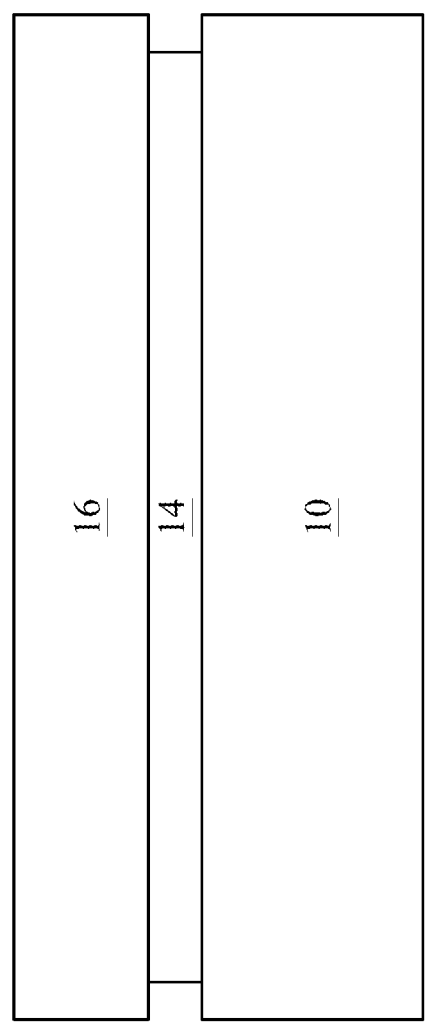

Referring to FIG. 2, a thinned wafer 16 is formed by thinning the wafer 12 shown in FIG. 1. The carrier wafer 10 serves as a holder for holding the wafer 12 shown in FIG. 1 while a thinning process is being performed on the wafer 12.

Figure 3:
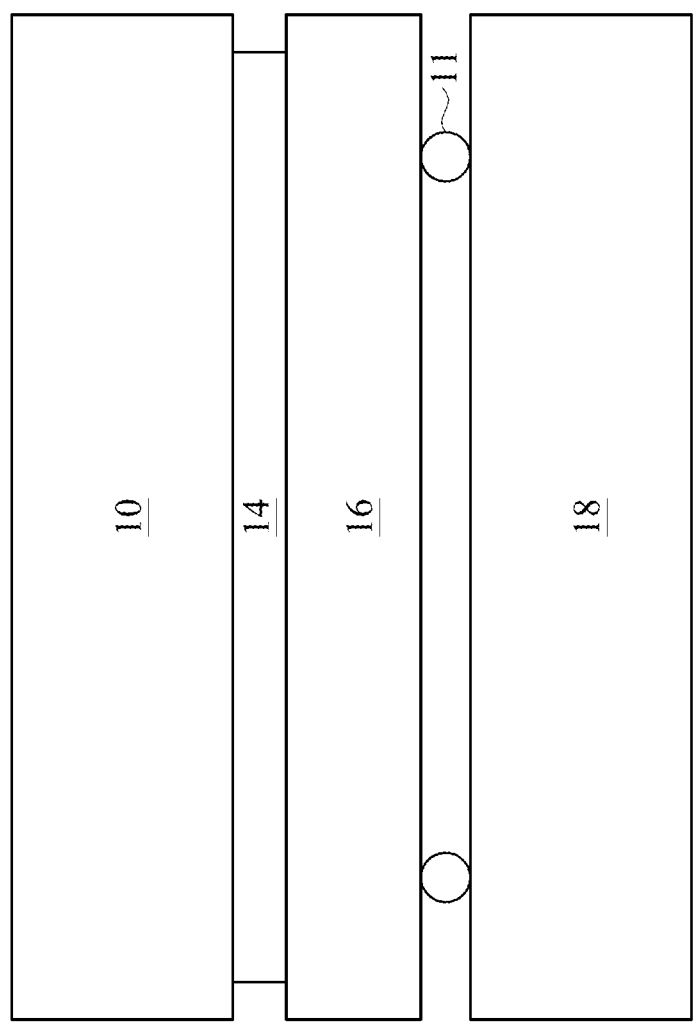

Before the bonding process shown in FIG. 3, a through-silicon via (TSV) process is performed on the wafer 12 shown in FIG. 1 or the thinned wafer 16 shown in FIG. 2, depending on the type of TSV process performed.

Referring to FIG. 3, the resultant structure shown in FIG. 2 is flipped, and then attached to another wafer 18 through, for example, conductive bumps 11. The wafer 18 has semiconductor components formed therein. The wafer 18 is based on a second technology. In some implementations, the second technology is different from the first technology. For example, the wafer 18 includes a periphery circuit for operating the DRAM formed in the thinned wafer 16. Functions performed by a die derived from the wafer 18 are different from functions performed by the thinned wafer 16. Alternatively, the wafer 18 is a wafer, which is fabricated based on a SiGe process. In other implementations, the second technology is the same as the first technology.

Figure 4:
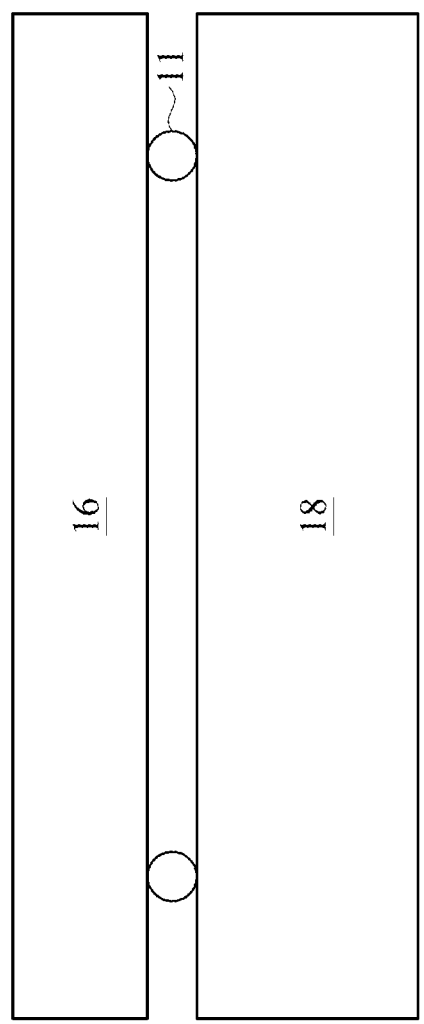

Referring to FIG. 4, a set of stacked wafers 15 (i.e., a two-tiered wafer stack) is formed by de-bonding the carrier wafer 10 along with the temporary adhesive 14 from the thinned wafer 16.

If it is desired to fabricate a multi-tiered wafer stack with more than two wafers in the stack, operations shown in FIGS. 1 to 4 are repeatedly performed. For example, an approach to fabricate a three-tiered stack of wafers is briefly summarized below. A die is temporarily bonded to a carrier wafer, thinned and bonded to the set of stacked wafers shown in FIG. 4. Next, the carrier wafer is de-bonded. During the process of manufacturing the multi-tiered wafer stack, a large number of carrier wafers are required for temporary bonding, and such requirement reduces the cost efficiency of the manufacturing process. In addition, a large number of temporary bonding processes and de-bonding processes are required to be performed. As a result, an integrated approach, shown in FIGS. 1 to 4, for manufacturing a 3D IC is relatively complicated and not efficient.

Figure 5:
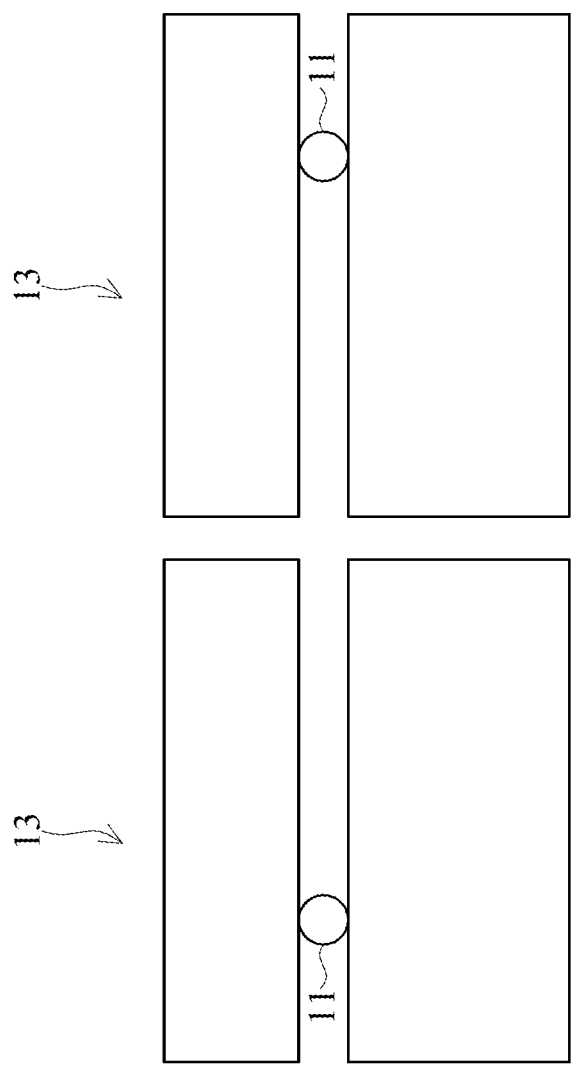

Referring to FIG. 5, a plurality of dies 13 are formed by singulating the set of stacked wafers 15 shown in FIG. 4.

FIGS. 6 to 9 are cross-sectional views of intermediate steps of a process of manufacturing stacked wafers, in accordance with some embodiments of the present disclosure. It should be understood that FIG. 6 to FIG. 9 have been simplified to facilitate a clear understanding of various embodiments of the present disclosure. For convenience of discussion, the wafer 18 is renamed as a first wafer 18, and the wafer 12 is renamed as the second wafer 12.

Figure 6:
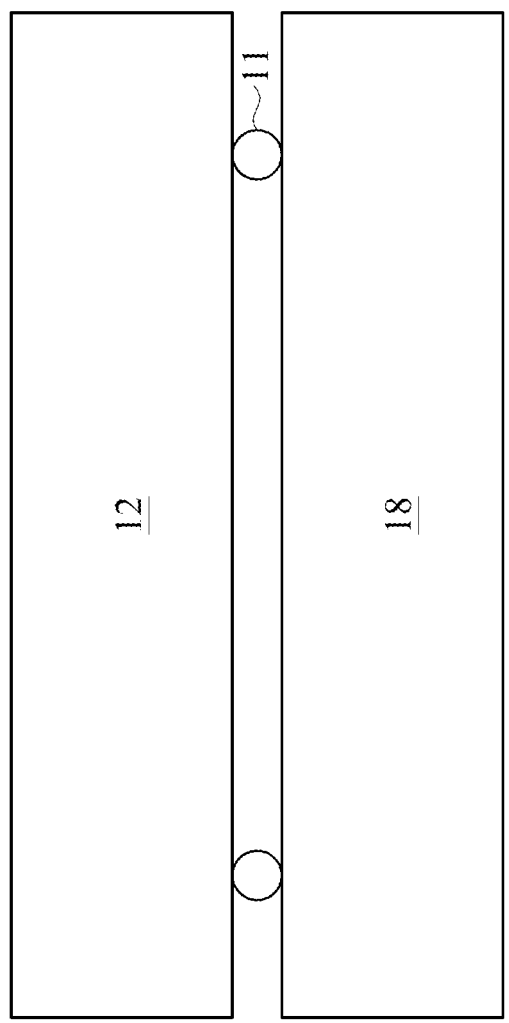
FIGS. 6 to 9 are cross-sectional views of intermediate steps of a process of manufacturing stacked wafers, in accordance with some embodiments of the present disclosure.

Referring to FIG. 6, the first wafer 18 is received, and the second wafer 12 is received. The first wafer 18 is attached to the second wafer 12.

Figure 7:
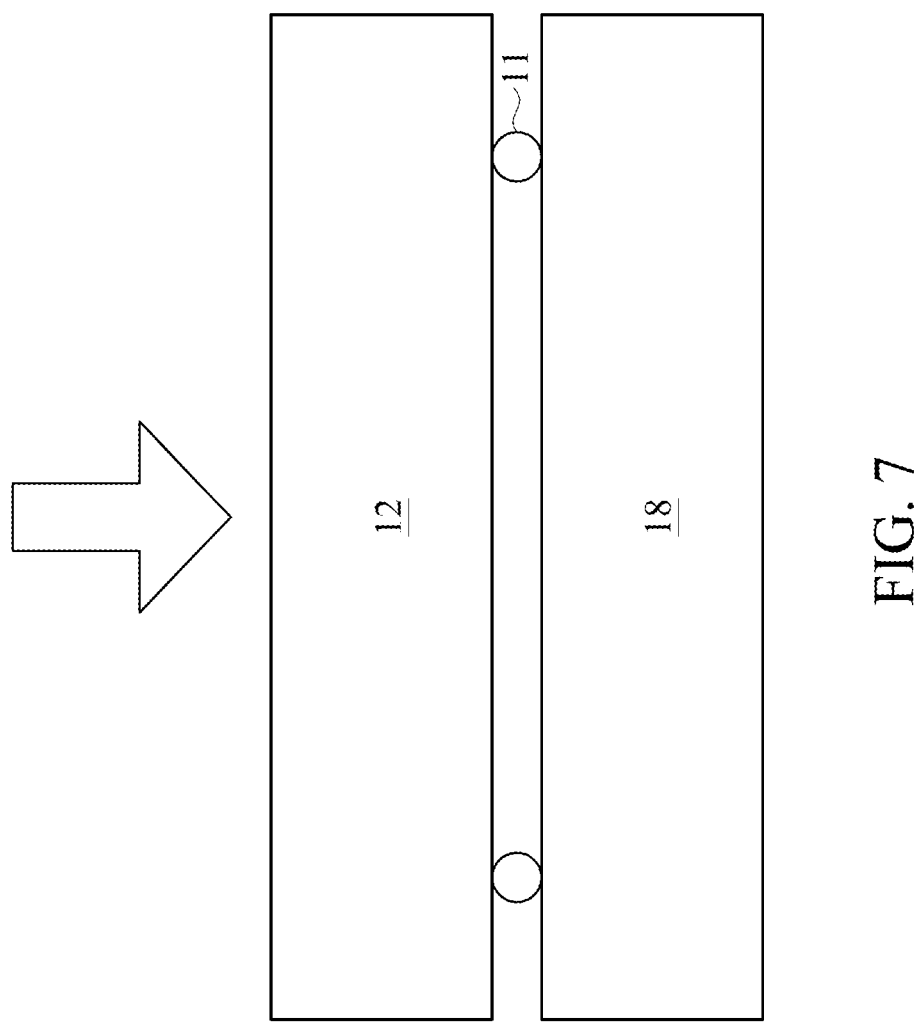

Referring to FIG. 7, a thinning process is performed on the second wafer 12, and the first wafer 18 serves as a holder for holding the second wafer 12 while the second wafer 12 is being thinned.

Figure 8:
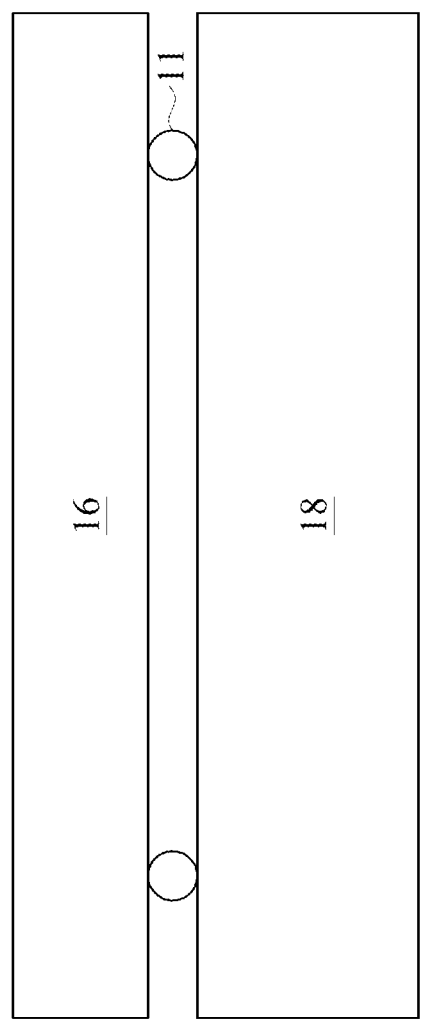

Referring to FIG. 8, a thinned second wafer 16 is formed by thinning the second wafer 12 shown in FIG. 7. Thus, a set of stacked wafers 15 is formed. The set of stacked wafers 15 includes the first wafer 18 and the thinned second wafer 16.

In the present disclosure, a carrier wafer, which may not have undergone the FEOL process, the MEOL process, the BEOL process, or any combination thereof and therefore is not intended to be prepared to become a plurality of dies to perform circuit operation, is not required. One of two wafers, both of which are intended to be prepared to become a plurality of dies to perform circuit operation, serves as the other wafer's holder while a thinning process is performed. The method of the present disclosure is relatively simple and efficient.

In some embodiments, a TSV process is performed on the set of stacked wafers 15, in particular, on the thinned second wafer 16, after the formation of the set of stacked wafers 15.

Figure 9:
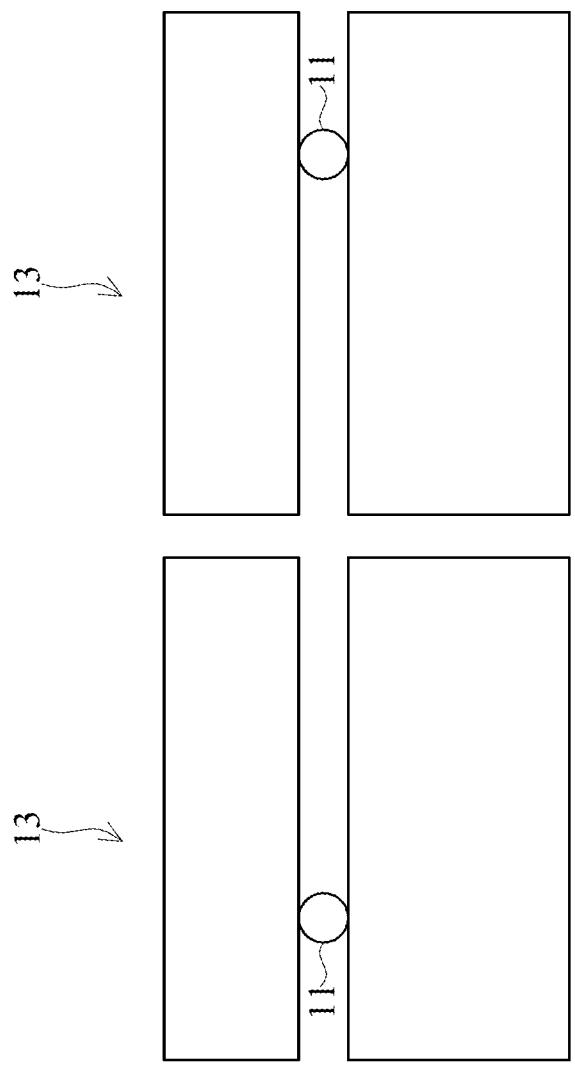

Referring to FIG. 9, a plurality of dies 13 are formed by singulating the set of stacked wafers 15 shown in FIG. 8.

In the method of the present disclosure, the first wafer 18 and the second wafer 12 remain attached to one another during the formation of the set of stacked wafers 15 and before the set of stacked wafers 15 are singulated.

In some embodiments, the method of the present disclosure further includes making the first wafer 18 based on a first technology, and making the second wafer 12 based on a second technology different from the first technology. In this case, the first wafer 18 is attached face-to-face with the second wafer 12 by, for example, using metal bumps 11. As a result, a heterogeneous integration is implemented. In the present disclosure, the term "face" and the term "back" are interpreted based on usage in the art. For example, the face refers to a surface of wafer on which and in which semiconductor components, such as passive components and active components, are formed or defined. A back of a wafer is opposite to the face of the wafer.

Figure 10:
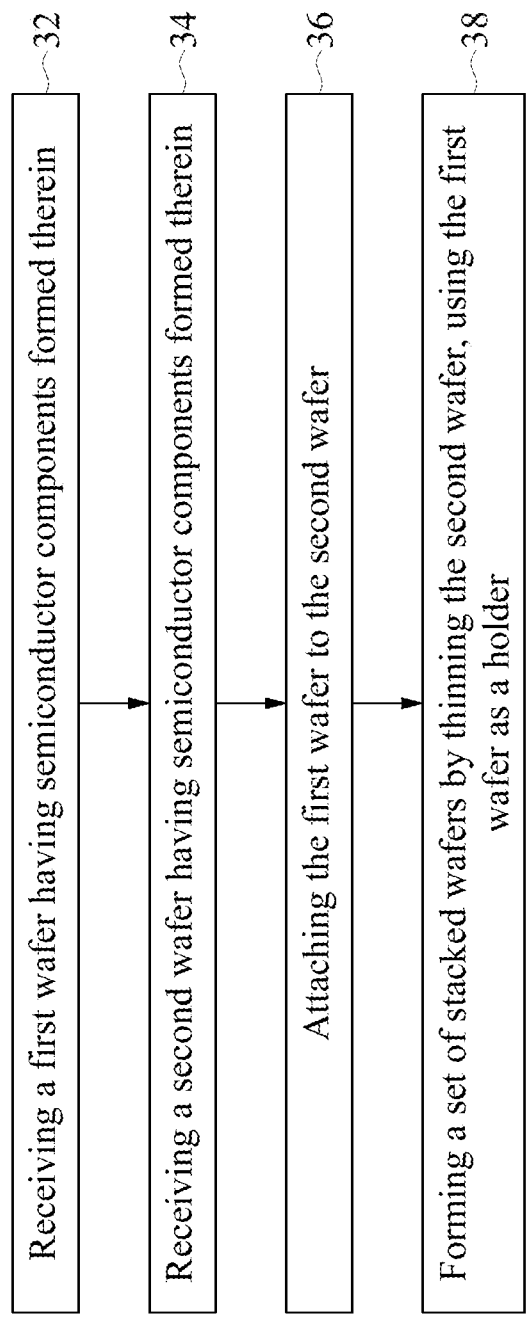
FIG. 10 is a flowchart of a method of manufacturing stacked wafers, in accordance with some embodiments of the present disclosure.

FIG. 10 is a flowchart of a method 30 of manufacturing stacked wafers, in accordance with some embodiments of the present disclosure. Referring to FIG. 10, the method 30 includes operations 32, 34, 36 and 38.

The method 30 begins with operation 32, in which a first wafer having semiconductor components formed therein is received.

The method 30 proceeds to operation 34, in which a second wafer having semiconductor components formed therein is received.

The method 30 continues with operation 36, in which the first wafer is attached to the second wafer.

The method 30 proceeds to operation 38, in which a set of stacked wafers is formed by thinning the second wafer, using the first wafer as a holder.

The method 30 is merely an example, and is not intended to limit the present disclosure beyond what is explicitly recited in the claims. Additional operations can be provided before, during, and after the method 30, and some operations described can be replaced, eliminated, or moved around for additional embodiments of the method.

FIGS. 11 to 14 are cross-sectional views of intermediate steps of a process of manufacturing stacked wafers, in accordance with some embodiments of the present disclosure. It should be understood that FIG. 11 to FIG. 14 have been simplified to facilitate a clear understanding of various embodiments of the present disclosure.

Figure 11:
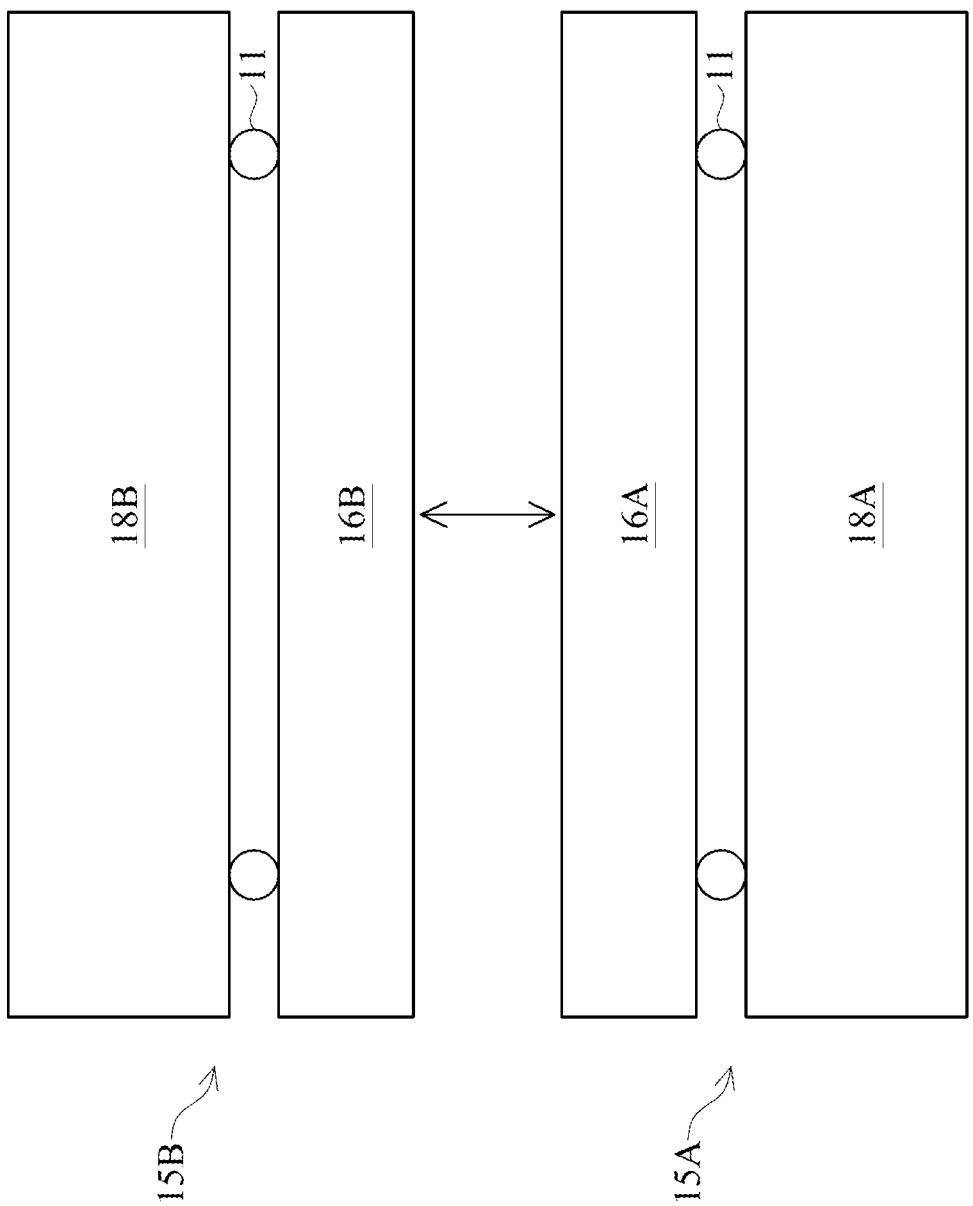
FIGS. 11 to 14 are cross-sectional views of intermediate steps of a process of manufacturing stacked wafers, in accordance with some embodiments of the present disclosure.

Referring to FIG. 11, two sets of stacked wafers 15 shown in FIG. 8 are illustrated. For distinguishing each set from the other, the letter "A" is added after the numeral for components of the first set, and the letter "B" is added after the numeral for components of the second set, if appropriate.

A first set of stacked wafers 15A of a first scale is received. In addition, a second set of stacked wafers 15B of a second scale is received. In the present example, the term "scale" refers to a quantity of wafers in a stack of wafers. The first and second sets of stacked wafers 15A and 15B have the same number of tiers (i.e., 2). As a result, the first scale equals the second scale. However, the present disclosure is not limited thereto. In some embodiments, the first scale is different from the second scale.

Figure 12:
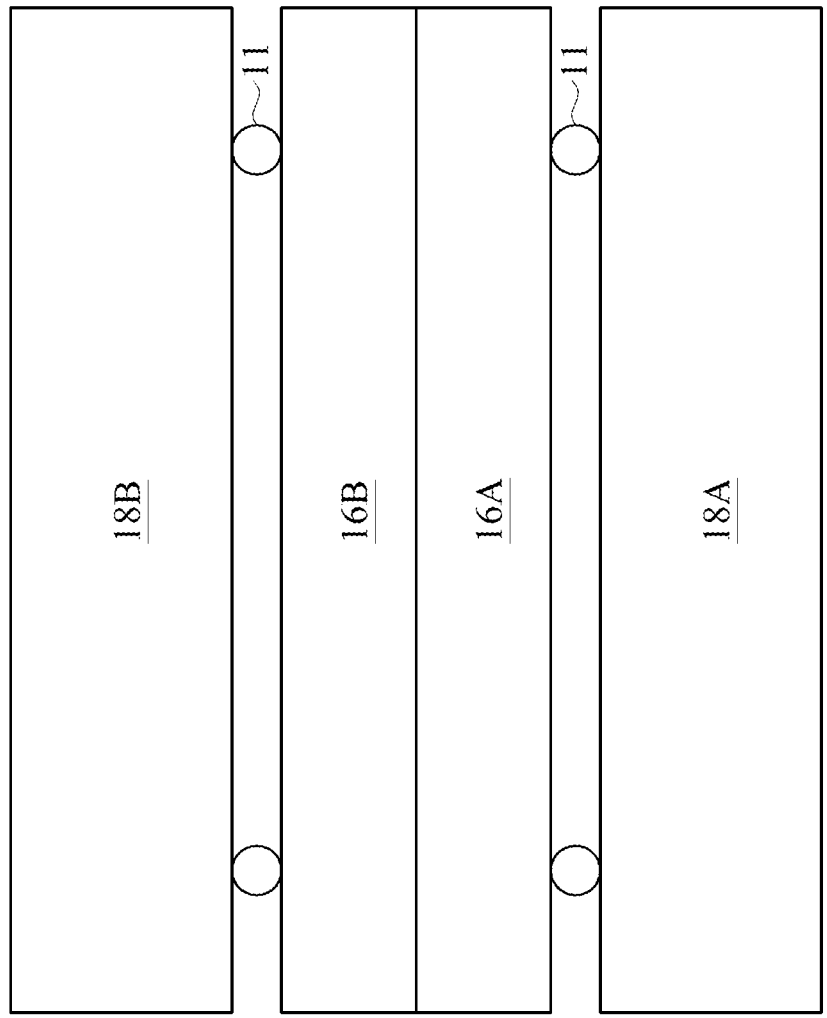

Referring to FIG. 12, the first set of stacked wafers 15A is attached to the second set of stacked wafers 15B by attaching a thinned wafer 16A of the first set of stacked wafers 15A to a thinned wafer 16B of the second set of stacked wafers 15B, resulting in a set of pre-stacked wafers 19. In some embodiments, the thinned wafer 16A and the thinned wafer 16B are based on the same technology; for example, each of the thinned wafer 16A and the thinned wafer 16B is a wafer, on which and in which a DRAM is formed. The thinned wafer 16A and the thinned wafer 16B, which are based on the same technology, communicate with each other using the TSV structure formed in the thinned wafer 16A and the TSV structure formed in the thinned wafer 16B.

In some embodiments, the non-thinned wafer 18A of the first set of stacked wafers 15A and the non-thinned wafer 18B of the second set of stacked wafers 15B are based on a first technology. The thinned wafer 16A of the first set of stacked wafers 15A and the thinned wafer 16B of the second set of stacked wafers 15B are based on a second technology different from the first technology. For example, each of the non-thinned wafers 18A and 18B is a wafer, on which and in which a DRAM is formed; and each of the thinned wafers 16A and 16B is a wafer, on which and in which a periphery circuit for operating the DRAM is formed.

Figure 13:
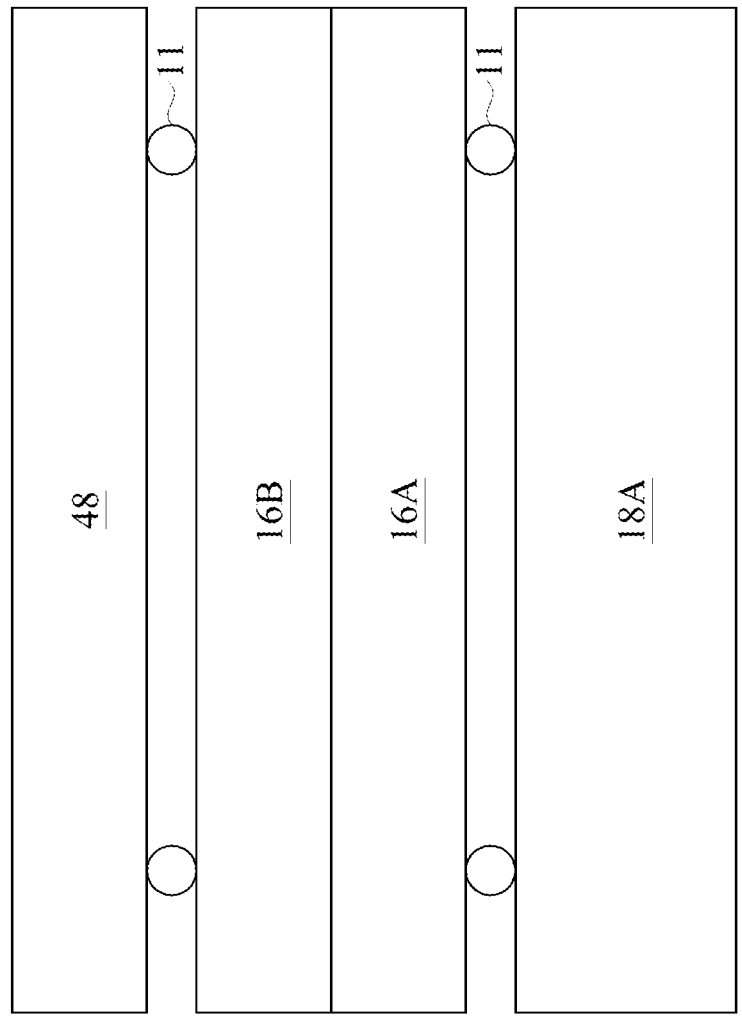

Referring to FIG. 13, a third set of stacked wafers 40 of a third scale is formed by thinning a non-thinned wafer 18B of the second set of stacked wafers 15B shown in FIG. 12, using a non-thinned wafer 18A of the first set of stacked wafers 15A as a holder. Thus, a thinned wafer 48 is formed. In the present embodiment, each of the first and second scales is two, and the third scale is four. The third scale is larger than each of the first scale and the second scale.

In the present disclosure, a carrier wafer, which may not have undergone the FEOL process, the MEOL process, the BEOL process, or any combination thereof and therefore is not intended to be prepared to become a plurality of dies to perform circuit operation, is not required. The method of the present disclosure is relatively simple and efficient.

In some embodiments, the first scale is smaller than the second scale. In this case, the non-thinned wafer 18A of the first set of stacked wafers 15A with the smaller scale serves as a holder.

In other embodiments, the first scale is larger than the second scale. In such cases, the non-thinned wafer 18A of the first set of stacked wafers 15A with the larger scale serves as a holder.

In some embodiments, a TSV process is performed on the third set of stacked wafers 40, in particular on the thinned wafer 48, after the formation of the third set of stacked wafers 40.

Figure 14:
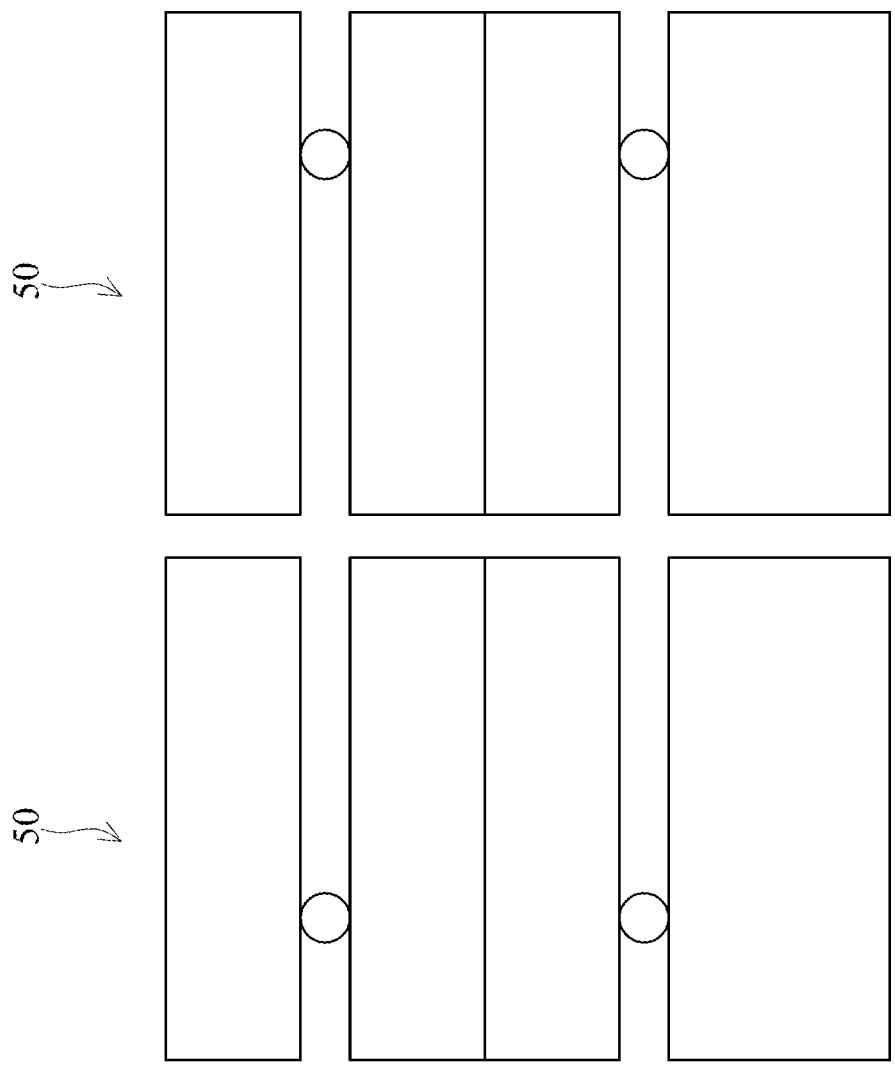

Referring to FIG. 14, a plurality of dies 50 are formed by singulating the third set of stacked wafers 40 shown in FIG. 13.

In the method of the present disclosure, all of the non-thinned wafer 18A and the thinned wafer 16A of the first set of stacked wafers 15A and the non-thinned wafer 18B and the thinned wafer 16B of the second set of stacked wafers 15B remain attached to one another during the formation of the third set of stacked wafers 40 and before the third set of stacked wafers 40 is singulated.

Figure 15:
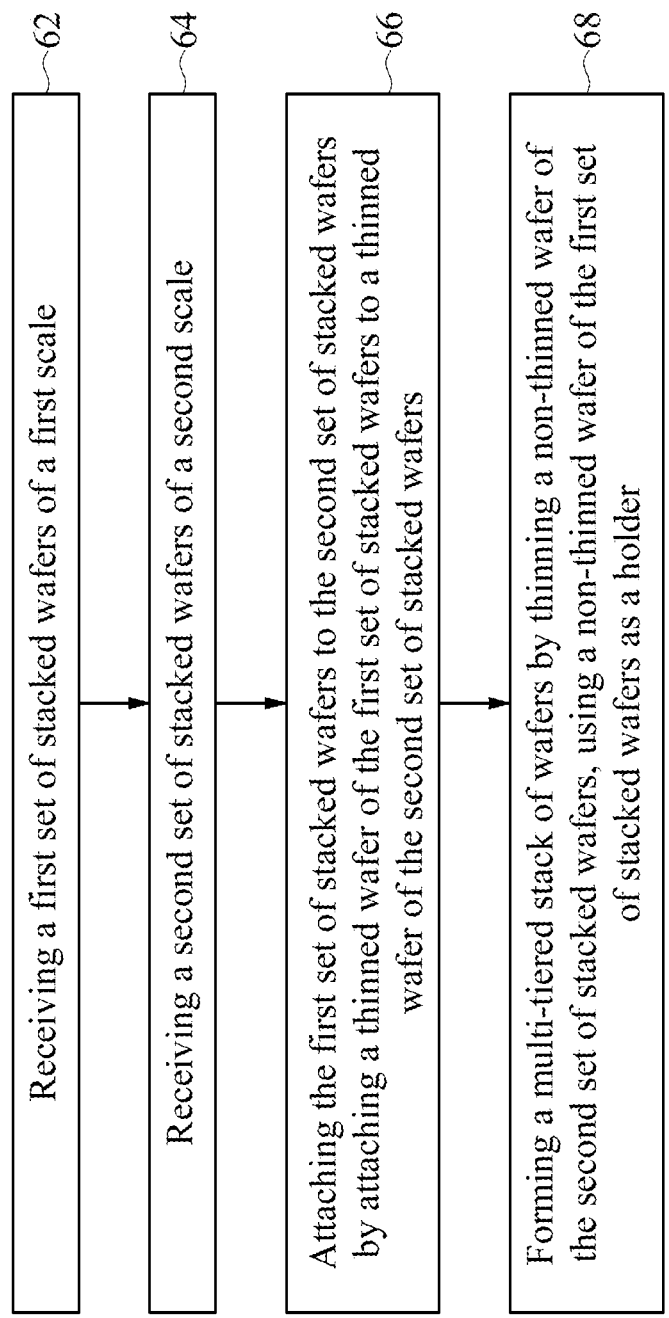
FIG. 15 is a flowchart of a method of manufacturing stacked wafers, in accordance with some embodiments of the present disclosure.

FIG. 15 is a flowchart of a method 60 of manufacturing stacked wafers, in accordance with some embodiments of the present disclosure. Referring to FIG. 15, the method 60 includes operations 62, 64, 66 and 68.

The method 60 begins with operation 62, in which a first set of stacked wafers of a first scale is received.

The method 60 continues with operation 64, in which a second set of stacked wafers of a second scale is received.

The method 60 proceeds to operation 66, in which the first set of stacked wafers is attached to the second set of stacked wafers by attaching a thinned wafer of the first set of stacked wafers to a thinned wafer of the second set of stacked wafers.

The method 60 continues with operation 68, in which a multi-tiered stack of wafers is formed by thinning a non-thinned wafer of the second set of stacked wafers, using a non-thinned wafer of the first set of stacked wafers as a holder.

The method 60 is merely an example, and is not intended to limit the present disclosure beyond what is explicitly recited in the claims. Additional operations can be provided before, during, and after the method 60, and some operations described can be replaced, eliminated, or moved around for additional embodiments of the method.

Figure 16:
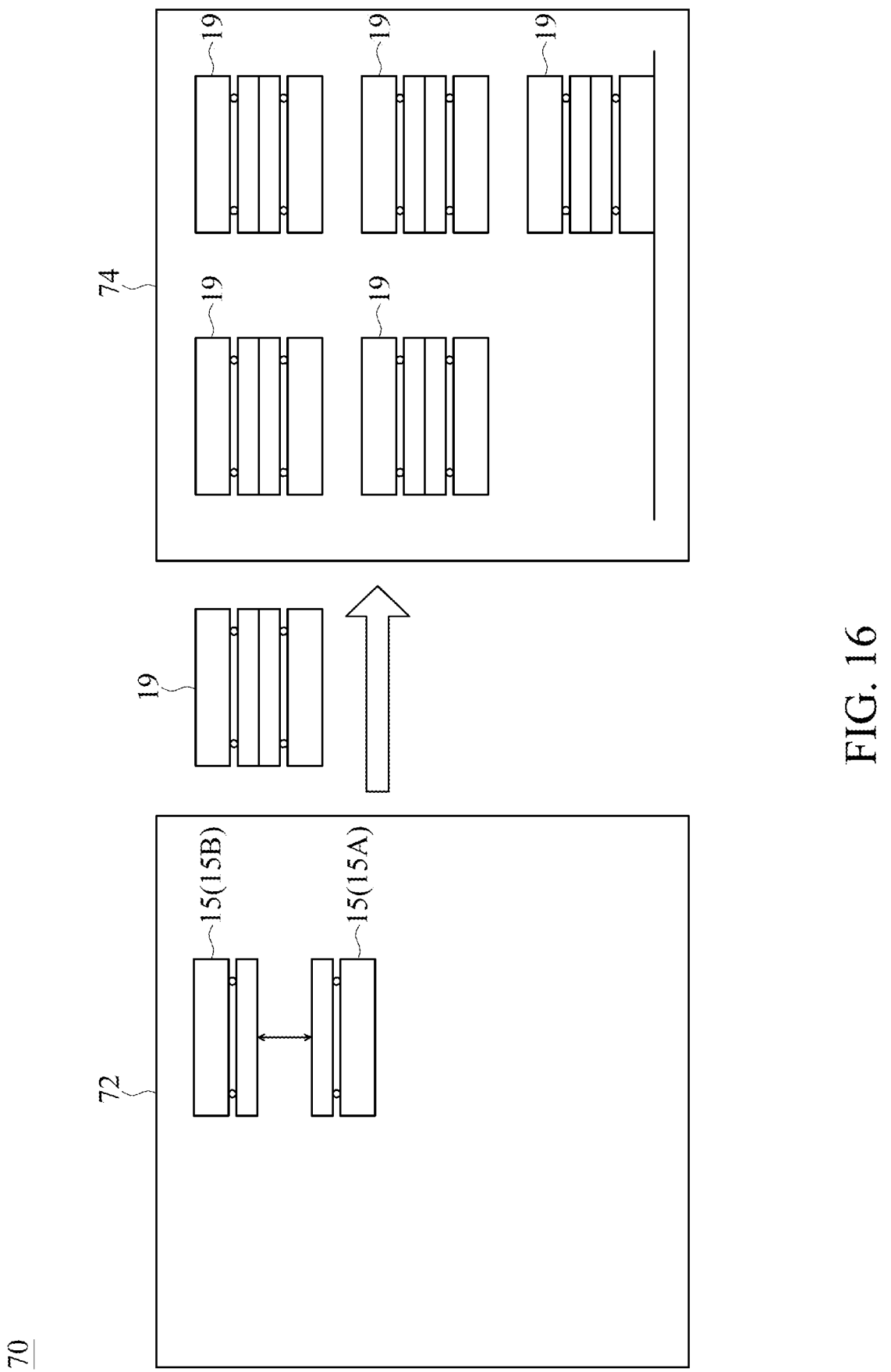
FIG. 16 is a schematic diagram of a system for manufacturing stacked wafers, in accordance with some embodiments of the present disclosure.

FIG. 16 is a schematic diagram of a system 70 for manufacturing stacked wafers, in accordance with some embodiments of the present disclosure. Referring to FIG. 16, the system 70 includes a workstation 72 and a bank 74.

The workstation 72 functions to manufacture the set of stacked wafers 15 shown in FIG. 8, and to provide a set of pre-stacked wafers 19 by attaching a first set of stacked wafers 15A to a second set of stacked wafers 15B in the manner shown in FIGS. 11 to 12.

The bank 74 functions to store a plurality of sets of pre-stacked wafers 19. In the present disclosure, because the set of pre-stacked wafers 19 has not yet undergone a thinning process, each of a top wafer and a bottom wafer of the set of pre-stacked wafers 19 is a non-thinned wafer. Therefore, the set of pre-stacked wafers 19 can be safely stored. A large quantity of the sets of pre-stacked wafers 19 can be prepared and safely stored in the bank 74 in advance of subsequent processing. Therefore, the manufacturing process is relatively efficient.

Figure 17:
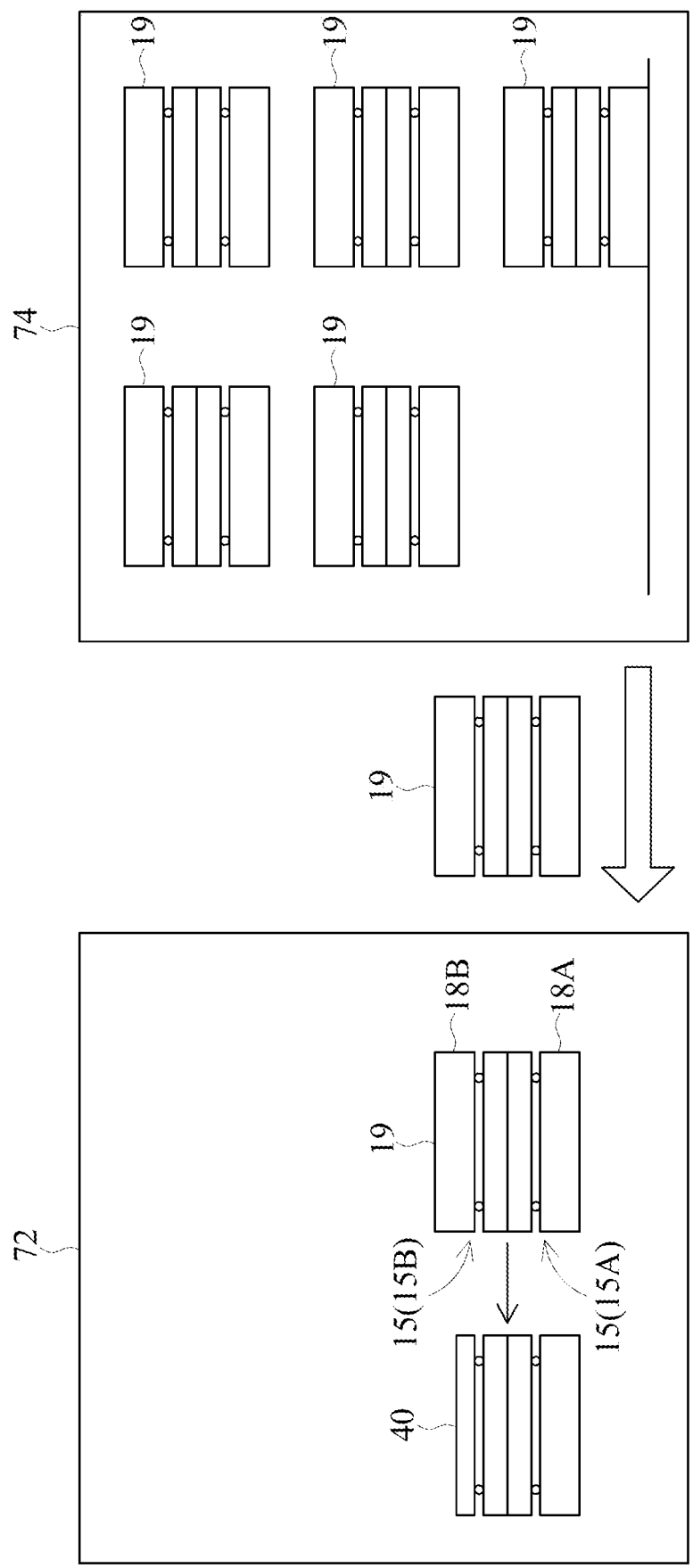
FIG. 17 is a schematic diagram illustrating an operation of the system shown in FIG. 16, in accordance with some embodiments of the present disclosure.
Figure 18:
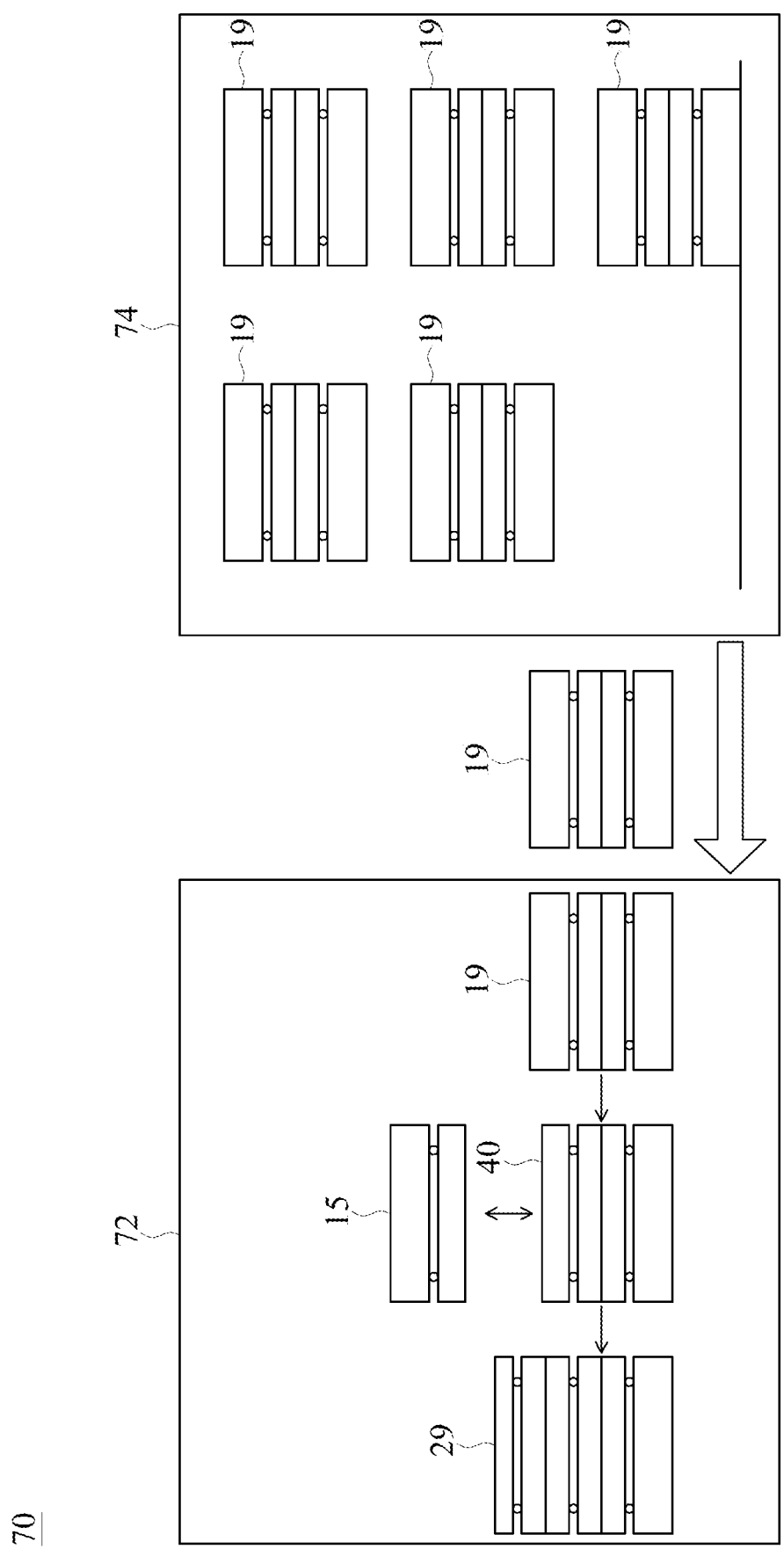
FIG. 18 is a schematic diagram illustrating another operation of the system shown in FIG. 16, in accordance with some embodiments of the present disclosure.

In addition, the bank 74 functions to store the set of pre-stacked wafers 19 until the bank 74 receives a request to manufacture a set of stacked wafers of a scale that is larger than a scale of one of the first set of stacked wafers 15A and the second set of stacked wafers 15B, as illustrated in FIGS. 17 and 18.

FIG. 17 is a schematic diagram illustrating an operation of the system shown in FIG. 16, in accordance with some embodiments of the present disclosure. Referring to FIG. 17, a request to manufacture a set of stacked wafers with a scale of four, which is larger than the first scale and the second scale, is received. Next, the bank 74 provides the set of pre-stacked wafers 19 to the workstation 72 in response to the request. The workstation 72 manufactures the third set of stacked wafers 40 by performing a thinning process on the set of pre-stacked wafers 19 as described and illustrated with reference to FIG. 13. In further detail, the workstation 72 manufactures the third set of stacked wafers 40 by thinning a non-thinned wafer 18B of the second set of stacked wafers 15B of the set of pre-stacked wafers 19, using a non-thinned wafer 18A of the first set of stacked wafers 15A of the set of pre-stacked wafers 19 as a holder. The scale of the third set of stacked wafers 40 is four, larger than the first scale and the second scale.

FIG. 18 is a schematic diagram illustrating another operation of the system shown in FIG. 16, in accordance with some embodiments of the present disclosure. Referring to FIG. 18, a request to manufacture a set of stacked wafers with a scale of six, which is larger than the first scale and the second scale, is received. Next, the bank 74 provides the set of pre-stacked wafers 19 to the workstation 72 in response to the request. The workstation 72 manufactures the set of stacked wafers 15. Subsequently, the workstation 72 manufactures the third set of stacked wafers 40 by performing a thinning process on the set of pre-stacked wafers 19 as described and illustrated with reference to FIG. 13. Next, the workstation 72 attaches the set of stacked wafers 15 to the third set of stacked wafers 40. Finally, a fourth set of stacked wafers 29 is formed by thinning a non-thinned wafer of the set of stacked wafers 15, and performing a TSV process on the set of stacked wafers 15. The fourth set of stacked wafers 29 has six tiers, more than the first scale and the second scale. Alternatively, the fourth set of stacked wafers 29 is formed by thinning a non-thinned wafer of the third set of stacked wafers 40, and performing a TSV process on the third set of stacked wafers 40.

In the present disclosure, a carrier wafer, which may not have undergone the FEOL process, the MEOL process, the BEOL process, or any combination thereof and therefore is not intended to be prepared to become a plurality of dies to perform circuit operation, is not required. One of two wafers, both of which are intended to be prepared to become a plurality of dies to perform circuit operation, serves as the other wafer's holder while a thinning process is performed.

One embodiment of the present disclosure provides a method of manufacturing stacked wafers. The method includes receiving a first wafer having semiconductor components formed therein; receiving a second wafer having semiconductor components formed therein; attaching the first wafer to the second wafer; and forming a set of stacked wafers by thinning the second wafer, using the first wafer as a holder.

Another embodiment of the present disclosure provides a semiconductor device. The semiconductor device includes a semiconductor substrate, a die and a seal ring. The die is configured to be in and on the semiconductor substrate, and to transmit a signal. The seal ring is configured to be on the semiconductor substrate, and to be adjacent to the die. The seal ring is insensitive to a change in magnetic flux, caused by the signal, through the seal ring.

The scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing stacked wafers, the method comprising:
   receiving a first wafer having a first face side in or on which first semiconductor components are formed and a first back side opposite to the first face side;
   receiving a second wafer having a second face side in or on which second semiconductor components are formed and a second back side opposite to the second face side;
   attaching the first wafer face-to-face with the second wafer via using metal bumps, wherein the first face side of the first wafer faces the second face side of the second wafer and the metal bumps are coupled with the first face side of the first wafer and the second face side of the second wafer; and
   forming a set of stacked wafers by thinning the second back side of the second wafer, using the first back side of the first wafer as a holder.

2. The method of claim 1, further comprising:
   making the first wafer based on a first technology; and
   making the second wafer based on a second technology different from the first technology.

3. The method of claim 1, further comprising:
   singulating the set of stacked wafers, wherein the set of stacked wafers includes the first wafer and the thinned second wafer.

4. The method of claim 3, wherein both of the first wafer and the second wafer remain attached to one another before the singulation of the set of stacked wafers.

5. The method of claim 1, further comprising:
   performing a through-silicon via (TSV) process on the set of stacked wafers after the formation of the set of stacked wafers.

6. A method of manufacturing stacked wafers, the method comprising:
   receiving a first set of stacked wafers of a first scale;
   receiving a second set of stacked wafers of a second scale;
   attaching the first set of stacked wafers to the second set of stacked wafers by attaching a first thinned back side of a thinned wafer of the first set of stacked wafers to a second thinned back side of a thinned wafer of the second set of stacked wafers; and
   forming a third set of stacked wafers of a third scale by thinning a third back side of a non-thinned wafer of the second set of stacked wafers, using a fourth back side of a non-thinned wafer of the first set of stacked wafers as a holder;
   wherein the thinned wafer of the first set of stacked wafers is attached face-to-face with the non-thinned wafer of the first set of stacked wafers via metal bumps, and the thinned wafer of the second set of stacked wafers is attached face-to-face with the non-thinned wafer of the second set of stacked wafers via metal bumps.

7. The method of claim 6, wherein the first scale is the same as the second scale.

8. The method of claim 6, wherein the first scale is different from the second scale.

9. The method of claim 8, wherein the first scale is larger than the second scale.

10. The method of claim 8, wherein the second scale is larger than the first scale.

11. The method of claim 6, wherein the non-thinned wafer of the first set of stacked wafers and the non-thinned wafer of the second set of stacked wafers are based on a first technology, and the thinned wafer of the first set of stacked wafers and the thinned wafer of the second set of stacked wafers are based on a second technology different from the first technology.

12. The method of claim 6, further comprising:
    singulating the third set of stacked wafers.

13. The method of claim 12, wherein all of the non-thinned wafer and the thinned wafer of the first set of stacked wafers and the non-thinned wafer and the thinned wafer of the second set of stacked wafers remain attached to one another before the singulation of the third set of stacked wafers.

14. The method of claim 6, further comprising:
    performing a through-silicon via (TSV) process on the third set of stacked wafers after the formation of the third set of stacked wafers.

* * * * *